(12) United States Patent  
Igarashi

(10) Patent No.: US 10,433,446 B2  
(45) Date of Patent: Oct. 1, 2019

(54) PROTECTOR

(71) Applicant: Power Support Co., Ltd., Tokyo (JP)

(72) Inventor: Katsushi Igarashi, Tokyo (JP)

(73) Assignee: Power Support Co., Ltd., Tokyo (JP)

( * ) Notice: Subject to any disclaimer, the term of this patent is extended or adjusted under 35 U.S.C. 154(b) by 0 days.

(21) Appl. No.: 15/553,774

(22) PCT Filed: Feb. 25, 2016

(86) PCT No.: PCT/JP2016/055636  
§ 371 (c)(1),  
(2) Date: Aug. 25, 2017

(87) PCT Pub. No.: WO2016/136879  
PCT Pub. Date: Sep. 1, 2016

(65) Prior Publication Data  
US 2018/0049338 A1 Feb. 15, 2018

(30) Foreign Application Priority Data  
Feb. 26, 2015 (JP) .................................. 2015-037279

(51) Int. Cl.  
*H04B 1/38* (2015.01)  
*H05K 5/03* (2006.01)  
*G09F 9/00* (2006.01)  
*H04B 1/3888* (2015.01)  
*H04M 1/02* (2006.01)  
(Continued)

(52) U.S. Cl.  
CPC ................. *H05K 5/03* (2013.01); *G09F 9/00* (2013.01); *H04B 1/3888* (2013.01); *H04M 1/0266* (2013.01); *H04M 1/185* (2013.01); *A45C 2011/002* (2013.01)

(58) Field of Classification Search  
CPC ..... H04B 1/08; H04B 1/3888; H04M 1/0266; H04K 5/00  
See application file for complete search history.

(56) References Cited

U.S. PATENT DOCUMENTS 8,451,599 B1* 5/2013 Mohoney ............... G06F 1/1632  
                                                 361/679.02  
9,215,916 B2* 12/2015 Kim ........................ G06F 1/166  
(Continued)

FOREIGN PATENT DOCUMENTS

JP          3059128 U     7/1999  
JP      2004-064416 A     2/2004  
(Continued)

OTHER PUBLICATIONS

International Search Report dated May 10, 2016, in connection with corresponding international application No. PCT/JP2016/055636 (2 pgs).

*Primary Examiner* — Tuan Pham  
(74) *Attorney, Agent, or Firm* — Maier & Maier, PLLC

(57) ABSTRACT

Provided is a screen protector that can be mounted on a terminal and is not peeled due to aging degradation. A protector mounted on a mobile information terminal includes a sheet configured to cover a screen of the mobile information terminal, and an engaging part formed from a periphery of the sheet and configured to be engaged with side faces of the mobile information terminal while holding the sheet on the screen.

8 Claims, 8 Drawing Sheets

(51) Int. Cl.
*H04M 1/18* (2006.01)
*A45C 11/00* (2006.01)

(56) References Cited

U.S. PATENT DOCUMENTS

| | | | | |
|---|---|---|---|---|
| 2014/0047708 A1* | 2/2014 | Chae | ............... | H04W 4/00 |
| | | | | 29/700 |
| 2014/0073377 A1* | 3/2014 | Chang | ............ | H04B 1/3888 |
| | | | | 455/575.8 |
| 2014/0211387 A1* | 7/2014 | Richardson | ........ | G06F 1/1626 |
| | | | | 361/679.01 |
| 2014/0364178 A1* | 12/2014 | Hynecek | ........... | H04B 1/3888 |
| | | | | 455/575.8 |

FOREIGN PATENT DOCUMENTS

| JP | 3107152 U | 1/2005 |
|---|---|---|
| JP | 2009-212700 A | 9/2009 |
| JP | 2014-166727 A | 9/2014 |

\* cited by examiner

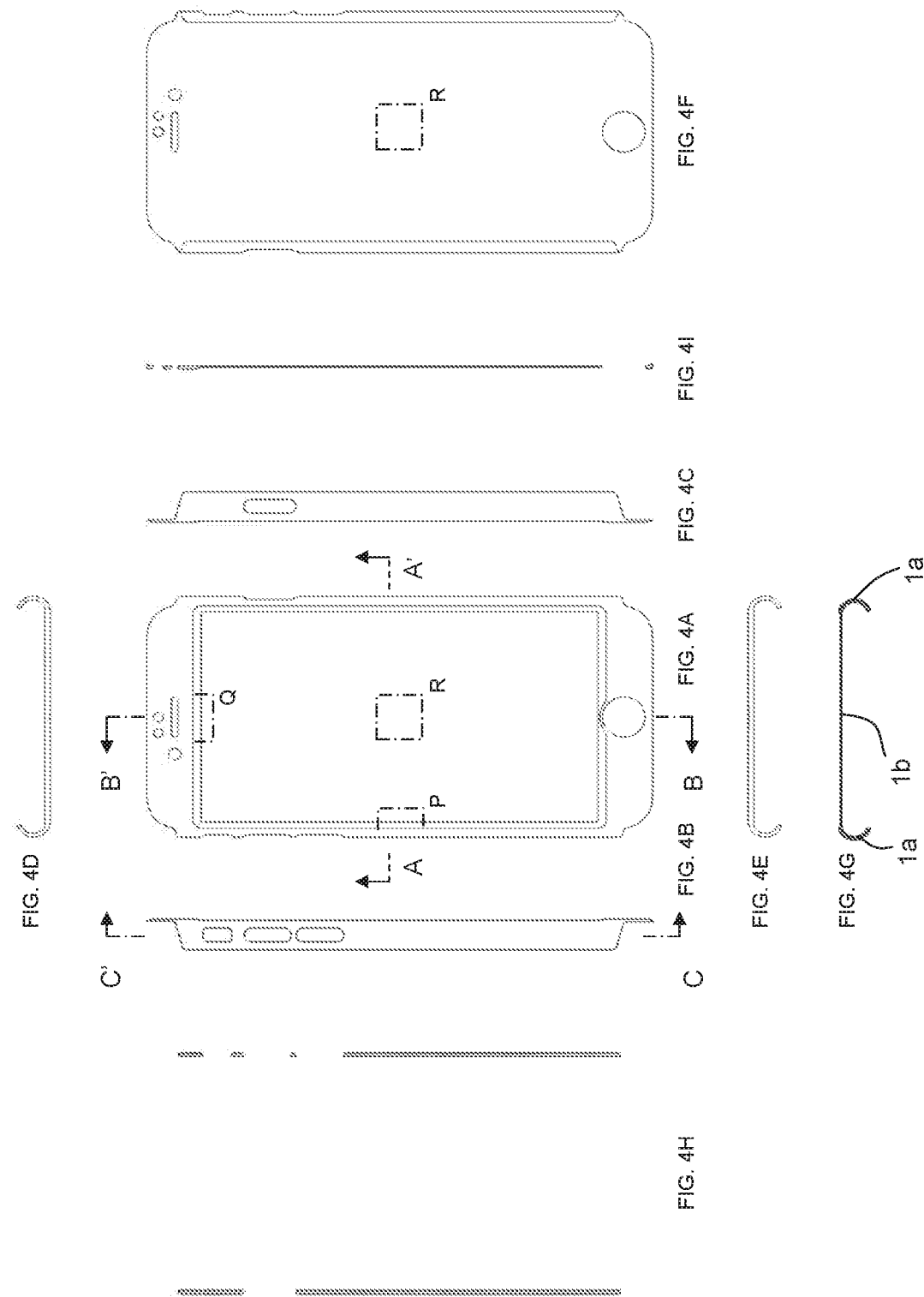

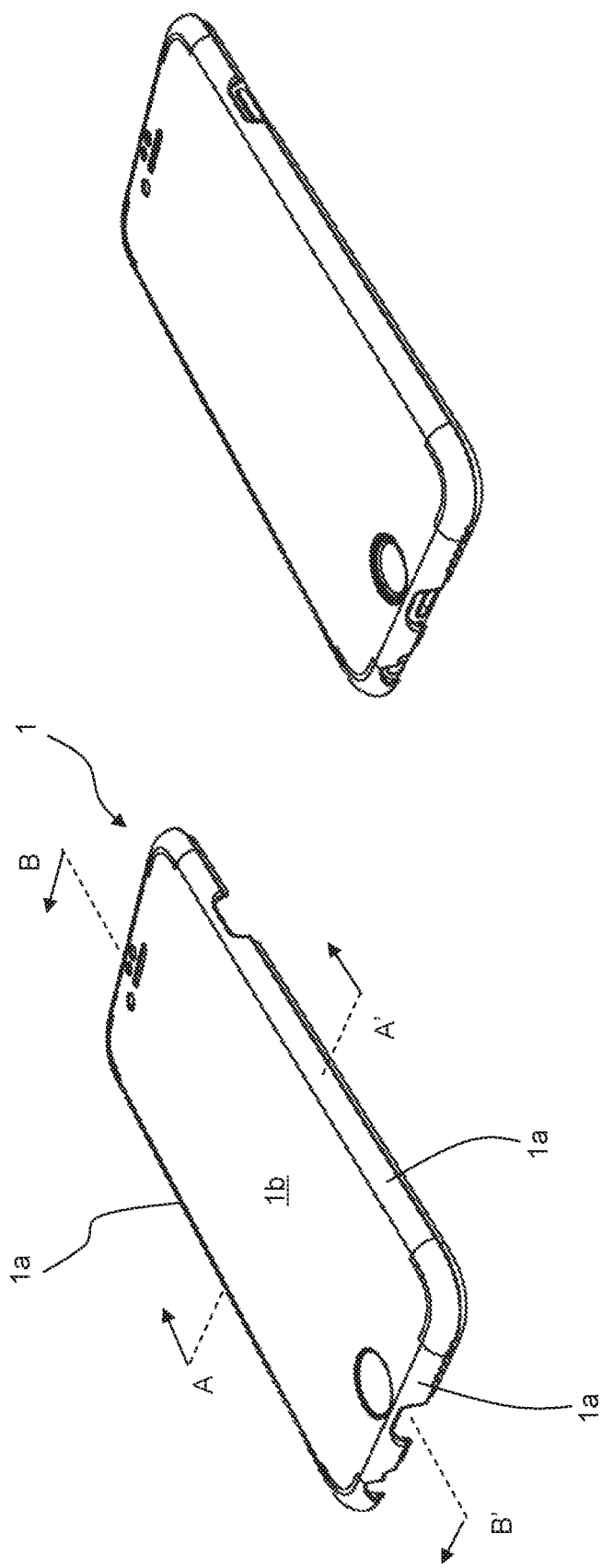

PROTECTOR

TECHNICAL FIELD

The present invention relates to a protector for use with touchscreen-equipped mobile information terminals, such as smartphones and tablet terminals.

BACKGROUND ART

Mobile information terminals, such as smartphones and tablet terminals, are commercially available from various companies and can be intuitively operated using a touchscreen. Mobile information terminals are being used by many users due to the high portability thereof.

Many users carry a smartphone or tablet terminal in a pocket or bag, and such a smartphone or tablet terminal is apt to be damaged. The screen is often broken depending on the conditions.

For this reason, protection films attached to the screens of smartphones and tablet terminals to protect the screens are being widely used.

Patent Literature 1 discloses a frame-shaped protection film attachment assisting tool that is able to position a protection film when attaching the protection film to the screen of a mobile device.

CITATION LIST

Patent Literature

[Patent Literature 1] Japanese Unexamined Patent Application Publication No. 2014-166727

SUMMARY OF INVENTION

Technical Problem

However, it is not easy to neatly attach a protection film to the screen. To neatly attach a protection film, it is necessary to remove dirt by wiping the screen using soft cloth, to position the protection film in a well dried state, and to attach the protection film while pressing it using a spatula or the like so that bubbles do not enter. The entry of bubbles is unfavorable, since it not only worsens the appearance but also makes the protection film more likely to be peeled and thus dirt or dust may enter the bubbles. Since stores are providing protection film attachment service on a chargeable basis, a user recognizes the need for a protection film when he or she buys a smartphone. However, he or she seems to feel that it would take time and effort to attach a protection film. For this reason, consideration has been made on how quickly and neatly a protection film can be attached, as disclosed in Patent Literature 1.

Unfortunately, no matter how quickly and neatly a protection film is attached, it is difficult to prevent a finger from being caught in the step between the end face of the protection film and the screen or to prevent the protection film from being peeled due to aging degradation. Unfavorably, each time the film is peeled, the user must buy a new protection film.

The present invention has been made in view of the foregoing, and an object thereof is to provide a screen protector that is easily mounted on a terminal and is not peeled.

Solution to Problem

The present invention provides a protector mounted on a mobile information terminal. The protector includes a sheet configured to cover a screen of the mobile information terminal and an engaging part formed from a periphery of the sheet and configured to be engaged with side faces of the mobile information terminal while holding the sheet on the screen.

A point of the present invention is that the engaging part configured to be engaged with the side faces of the terminal while holding the sheet on the screen of the terminal is formed on the periphery of the sheet. Thus, the protector can be easily mounted on the terminal without having to position it as has been done while preventing the entry of bubbles. Also, the absence of a step between the sheet and screen prevents a finger from being caught in such a step or prevents the protector from being peeled due to aging degradation. The present inventor has completed the present invention on the basis of an idea that the protector is not attached to the terminal but mounted thereon unlike a conventional protection film.

Various embodiments of the present invention are described below as examples. Any embodiments below can be combined with each other.

Preferably, the engaging part has bent faces matched to shapes of the side faces of the mobile information terminal.

Preferably, the engaging part has greater thickness than the sheet.

Preferably, the sheet and the engaging part are formed with a slope therebetween, the slope being formed on a periphery of the sheet.

Preferably, the protector further includes a protection part formed on the periphery of the sheet and configured to cover a front face of the mobile information terminal.

Preferably, the sheet is formed so as to extend beyond an area corresponding to the screen of the mobile information terminal, and the sheet and the engaging part are formed with a slope therebetween, the slope being formed on the periphery of the sheet.

Preferably, the sheet is 0.3 to 0.4 mm thick.

Preferably, the engaging part is 0.5 to 0.7 mm thick.

BRIEF DESCRIPTION OF THE DRAWINGS

FIGS. 4A to 4I are six-side views of the protector of the first embodiment, in which FIG. 4A is a front view; FIG. 4B is a left-side view; FIG. 4C is a right-side view; FIG. 4D is a plan view; FIG. 4E is a bottom view; FIG. 4F is a rear view; FIG. 4G is an end face view of a line A-A' section of FIG. 4A; FIG. 4H is an end face view of a line C-C' section of FIG. 4B; and FIG. 4I is an end face view of a line B-B' section of FIG. 4A.

FIG. 5A is a perspective view of a protector of a second embodiment, and FIG. 5B is a drawing showing a state in which the protector of the second embodiment is mounted on a mobile information terminal.

FIGS. 8A to 8G are six-side view of the protector of the second embodiment, in which FIG. 8A is a front view; FIG. 8B is a left-side view; FIG. 8C is a right-side view; FIG. 8D is a plan view; FIG. 8E is a bottom view; FIG. 8F is a rear view; and FIG. 8G is an end face view of a line F-F' section of FIG. 8A.

DETAILED DESCRIPTION

Now, embodiments of the present invention will be described. However, the embodiments below are illustrative only and do not limit the scope of the present invention.

1. First Embodiment

Figure 1B:
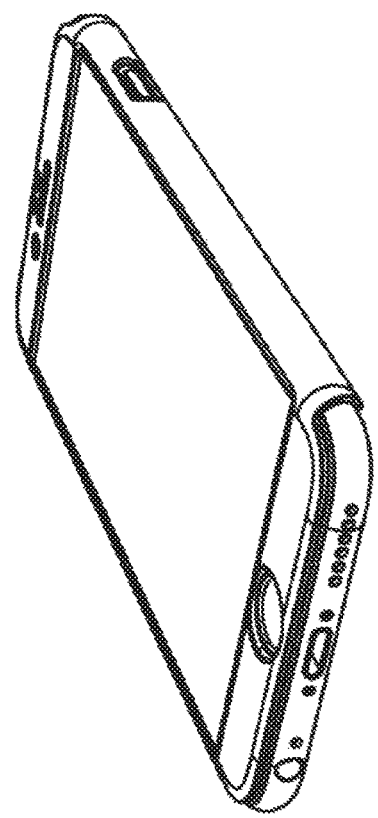
FIG. 1B is a drawing showing a state in which the protector of the first embodiment is mounted on a mobile information terminal.
Figure 1A:
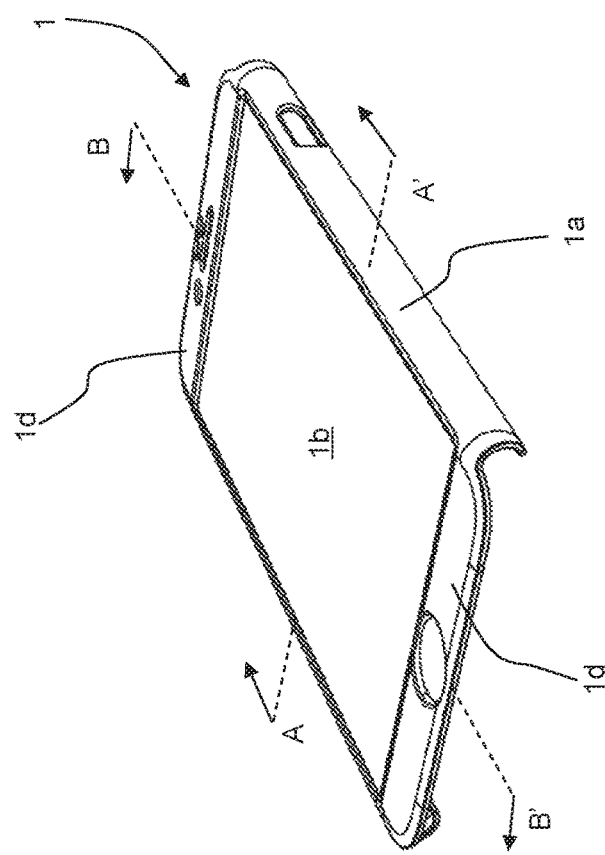
FIG. 1A is a perspective view of a protector of a first embodiment.

Referring to FIGS. 1A and 1B, a protector 1 of a first embodiment of the present invention will be described. As shown in FIG. 1, the protector 1 of the first embodiment is mounted on the front face of a mobile information terminal, for example, iPhone 6 available from Apple Inc. The protector 1 is formed of, for example, polycarbonate and includes a sheet 1b configured to cover a touchscreen and an engaging part 1a having greater thickness than the sheet 1b with a slope 1c (to be discussed later) therebetween. The engaging part 1a consists of bends located at the left and right edges of the sheet 1b and is engaged with the left and right side faces of the terminal. A protection part 1d covers upper and lower portions of the front face of the terminal. The protection part 1d has a thickness similar to that of the engaging part 1a and is formed seamlessly with the engaging part 1a and sheet 1b. Thus, the protector 1 is able to firmly protect the side faces and front face of the terminal. The sheet 1b is intended to protect the touchscreen and is preferably 0.3 to 0.4 mm thick. This is because both shock resistance and touchscreen sensitivity must be achieved. While a thicker sheet would resist greater shock, too thick a sheet would reduce the sensitivity of the touchscreen to a touch operation. The engaging part 1a is thicker than the sheet 1b and is, for example, 0.5 to 0.7 mm thick. It is intended to protect parts other than the touchscreen from shock while being engaged with the terminal. The sheet 1b is held on the touchscreen by the engaging part 1a. As used herein, the term "the sheet 1b is held on the touchscreen" includes not only a state in which it adheres to the touchscreen but also an aspect in which it is held so as to be spaced from the touchscreen by a predetermined distance. Since the protector 1 formed of polycarbonate transmits light, the touchscreen can be visually recognized through the sheet 1b.

Figure 2B:
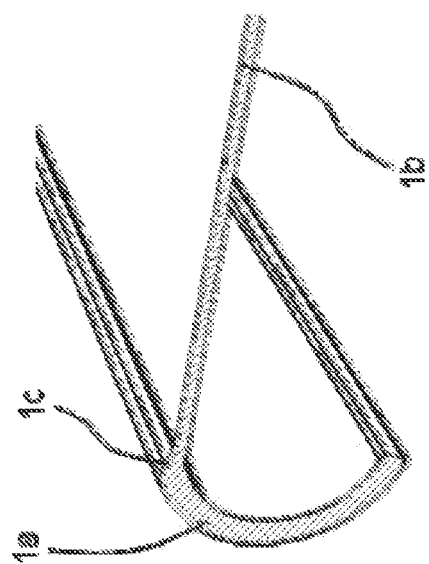
FIG. 2B is an enlarged view of an area X in FIG. 2A.
Figure 2A:
FIG. 2A is an A-A' sectional view of FIG. 1A.

FIG. 2A is an A-A' sectional view of FIG. 1A, and FIG. 2B is an enlarged view of an area X in FIG. 2A. The sheet 1b and engaging part 1a are seamlessly formed at locations corresponding to the left and right edges of the touchscreen with the slope 1c therebetween. The engaging part 1a is bent and engaged with the left and right side faces of the terminal.

Figure 3B:
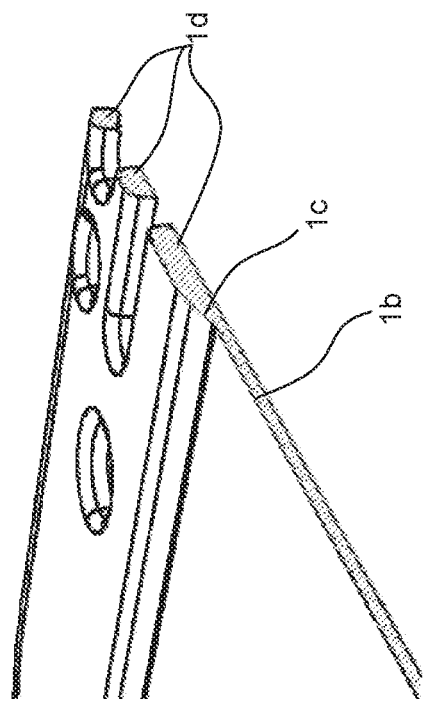
FIG. 3B is an enlarged view of an area Y in FIG. 3A.
Figure 3A:
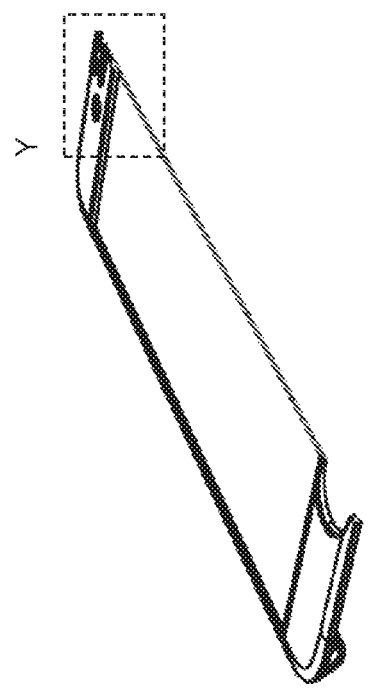
FIG. 3A is a B-B' sectional view of FIG. 1A.

FIG. 3A is a B-B' sectional view of FIG. 1A, and FIG. 3B is an enlarged view of an area Y in FIG. 3A. The sheet 1b and protection part 1d are seamlessly formed at locations corresponding to the upper and lower edges of the touchscreen with the slope 1c therebetween.

FIGS. 4A to 4I are six-side views of the protector of the first embodiment, in which FIG. 4A is a front view; FIG. 4B is a left-side view; FIG. 4C is a right-side view; FIG. 4D is a plan view; FIG. 4E is a bottom view; FIG. 4F is a rear view; FIG. 4G is an end face view of a line A-A' section of FIG. 4A; FIG. 4H is an end face view of a line C-C' section of FIG. 4B; and FIG. 4I is an end face view of a line B-B' section of FIG. 4A. Areas P and Q are characteristic portions of the areas X and Y shown in FIGS. 2A and 3A. An area R is a part of the sheet 1b. In the first embodiment, the areas P, Q, and R are characteristic. In the protector 1 of the first embodiment, the sheet 1b has the same configuration as the area P in the length direction and has the same configuration as the area Q in a direction perpendicular to the length direction.

According to this configuration, when the protector 1 is pressed against the front face of the terminal, the engaging part 1a is engaged with and fixed to the side faces of the terminal, and the sheet 1b, which is formed seamlessly with the engaging part 1a with the slope 1c therebetween, is held on the touchscreen. Thus, the touchscreen is protected. As seen above, the protector 1 can be easily mounted on the terminal without having to worry about bubbles, unlike in a conventional protection film, and without having to position the protector. Also, the absence of a step between the sheet 1b and screen prevents a finger from being caught in such a step or prevents the sheet from being peeled due to aging degradation. Thus, once the protector 1 is mounted, dirt or dust no longer enters. Also, unlike a conventional sheet, the sheet 1b does not have to have an attachment surface to the terminal. As used herein, the term "attachment surface" refers to a surface to be attached to the screen of the terminal and, more specifically, refers to a surface of the material itself of the sheet to be attached to the screen of the terminal using a sealant or paste. Also, even in the case of a terminal including a touchscreen that is formed of glass and is rounded (treated so that the edges of glass are curved), such as iPhone6, the protector 1 is able to reliably protect the touchscreen including the curved portions.

While, in the first embodiment, the slope 1c is approximately linear, the slope 1c may be smoothly curved. Thus, for example, the touchscreen can be smoothly swiped (a finger in contact with the screen can be smoothly slid) from outside. This is advantageous, since there exist terminals in which different functions are assigned to a swipe within the touchscreen and a swipe from outside the touchscreen, and the user of such a terminal often swipes the touchscreen from outside. While the engaging part is bent, it may be, for example, U-shaped as long as it is shaped so as to be engaged with the side faces of the terminal. Also, while the engaging part 1a is seamlessly formed on the periphery of the sheet 1b with the slope 1c therebetween, it may be seamlessly formed on a slightly inner portion of the periphery of the sheet 1b. Also, the engaging part 1a may be formed on the periphery of the sheet 1b and a slightly inner portion of the periphery with a joint member or support member therebetween.

2. Second Embodiment

Referring to FIG. 5, a protector 1 of a second embodiment of the present invention will be described. Note that the same elements as those in FIG. 1 are given the same reference signs.

Unlike in the first embodiment, a sheet 1b of the protector 1 of the second embodiment broadly covers the front face of the terminal so as to extend beyond the touchscreen. An engaging part 1a is formed on the periphery of the sheet 1b. In the protector 1 of the second embodiment, the engaging part 1a is bent from the upper and lower and left and right edges of the sheet 1b so as to cover the side faces of the terminal and is engaged with the upper and lower and left and right side faces of the terminal.

Figure 6B:
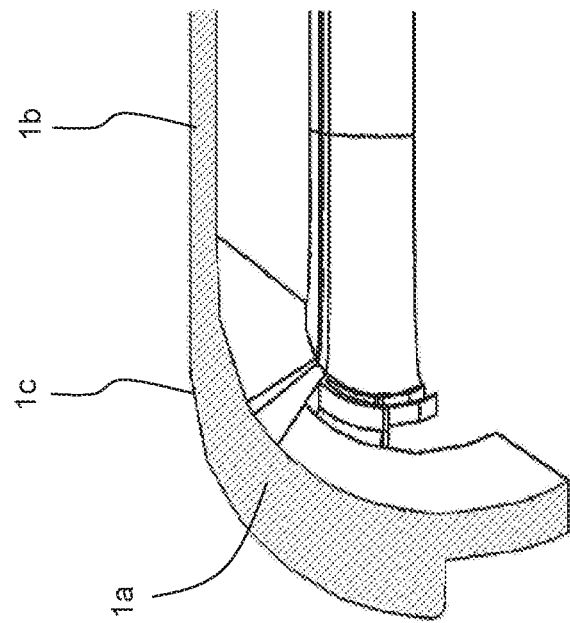
FIG. 6B is an enlarged view of an area X' in FIG. 6A seen from a direction D.
Figure 6A:
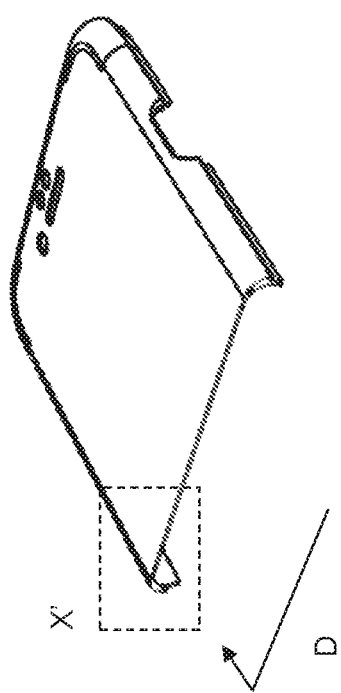
FIG. 6A is an A-A' sectional view of FIG. 5A.

FIG. 6A is an A-A' sectional view of FIG. 5A, and FIG. 6B is an enlarged view of an area X' in FIG. 6A seen from a direction D. The sheet 1b broadly covers the front face of the terminal so as to extend beyond the touchscreen. The engaging part 1a is seamlessly formed near the edges of the sheet 1b with the slope 1c therebetween. In the area X', the engaging part 1a is engaged with the left and right side faces of the terminal to protect those side faces.

Figure 7B:
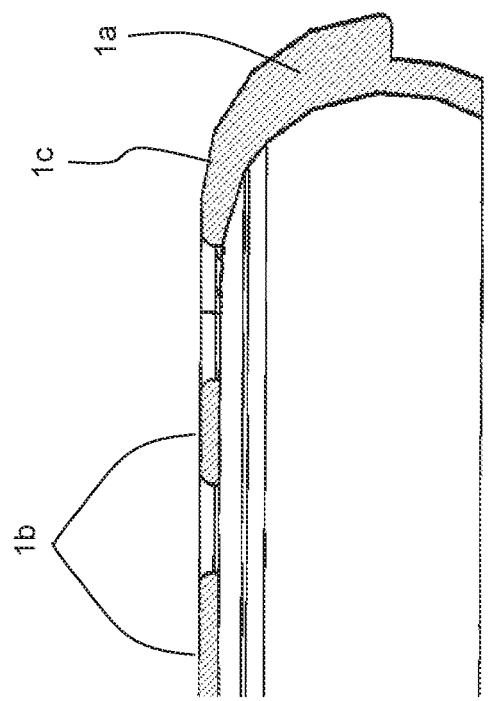
FIG. 7B is an enlarged view of an area Y' in FIG. 7A seen from a direction E.
Figure 7A:
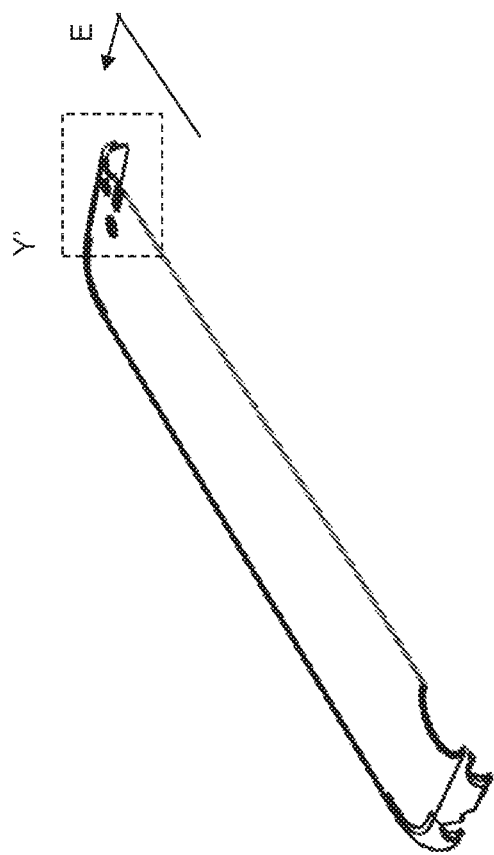
FIG. 7A is a B-B' sectional view of FIG. 5A.

FIG. 7A is a B-B' sectional view of FIG. 5A, and FIG. 7B is an enlarged view of an area Y' in FIG. 7A seen from a direction E. The sheet 1b having holes at locations corresponding to a microphone and camera in an upper portion of the terminal broadly covers the front face of the terminal so as to extend beyond the touchscreen. The engaging part 1a is seamlessly formed near the edges of the sheet 1b with the slope 1c therebetween. In the area Y', the engaging part 1a is engaged with the upper and lower side faces of the terminal to protect those side faces.

Figure 8F:
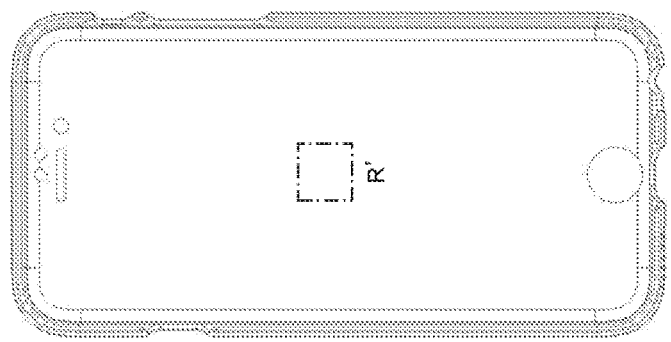
Figure 8C:
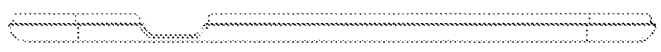
Figures 8A, 8D, 8E:
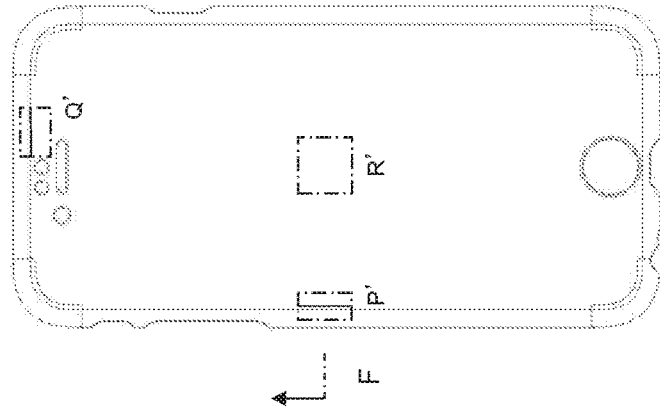
Figure 8B:
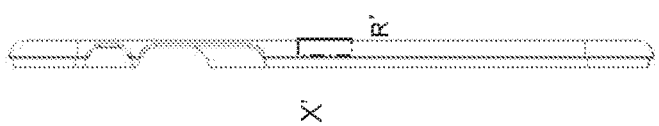
Figure 8G:
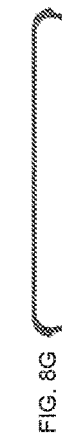

FIGS. 8A to 8G are six-side views of the protector of the second embodiment, in which FIG. 8A is a front view; FIG. 8B is a left-side view; FIG. 8C is a right-side view; FIG. 8D is a plan view; FIG. 8E is a bottom view; FIG. 8F is a rear view; and FIG. 8G is an end face view of a line F-F' section of FIG. 8A. Areas P' and Q' are characteristic portions of the areas X' and Y' shown in FIGS. 6A and 7A. An area R' is a part of the sheet 1b. In the protector 1 of the second embodiment, the sheet 1b has the same configuration as the area P' in the length direction and has the same configuration as the area Q' in a direction perpendicular to the length direction.

According to this configuration, there is provided a protector that is easily attached to a terminal without having to position it and that prevents the entry of bubbles and dirt or dust, as in the first embodiment. Also, the sheet 1b broadly covers the front face of the terminal. Thus, no step is made between the sheet 1b and screen, preventing a finger from being caught in such a step and thus improving the usability. While, in the second embodiment, the engaging part 1a is configured to be engaged with the upper and lower side faces and left and right side faces of the terminal, it may be configured to be engaged with only the left and right side faces or upper and lower side faces, or the four corners of the terminal.

The breakage of the screen of a terminal is often caused by a fall of the terminal. Typically, the screen is damaged more significantly when the terminal falls with the front face thereof not in parallel with the ground but inclined with respect thereto or when the terminal falls in such a manner that any corner thereof first lands on the ground than when the terminal falls with the screen facing the ground, that is, with the front face in parallel with the ground. Since, in the second embodiment, the engaging part 1a protects the terminal so as to cover the upper and lower and left and right side faces of the terminal, the protector is able to firmly protect the terminal even if the terminal falls in unfavorable manners as described above.

While the first and second embodiments have been described above, the present invention is not limited thereto. For example, the sheet 1b may be thinner than 0.3 mm, and the engaging part may be thicker than 0.7 mm. Also, the protector may be formed of a material other than polycarbonate. For example, the thicknesses of the sheet 1b and engaging part 1a may be made similar by forming these elements from different materials. Also, the protector may be used along with a protection case that is mounted on the rear face of the terminal. In this case, the rear face of the terminal can also be protected.

In the protectors 1 of the first and second embodiments, the sheet 1b and engaging part 1a are formed with the slope 1c therebetween. These elements only have to be seamlessly formed, or continuously formed, or integrally formed. Also, a boundary may exist between the sheet 1b and engaging part 1a. For example, if the protector is formed by double-molding or the like, a boundary occurs between two resins. Even in this case, the engaging part 1a only has to be formed on the periphery of the sheet 1b.

For example, the sheet 1b and engaging part 1a may be molded together. Thus, a precise protector can be produced cheaply with less production man-hours.

DESCRIPTION OF REFERENCE SIGNS

1: protector, 1a: engaging part, 1b: sheet, 1c: slope, 1d: protection part

The invention claimed is:

1. A protector mounted on a mobile information terminal, comprising:
   a sheet configured to cover a screen of the mobile information terminal; and
   an engaging part formed from a periphery of the sheet and configured to couple to left or right side face of the mobile information terminal while holding the sheet on the screen,
   wherein the sheet and the engaging part are integrally formed,
   the engaging part is formed in an arc shape so as to couple to the left or right side face of the mobile information terminal,
   the engaging part extends from a front face of the mobile information terminal to a back face of the mobile information terminal,
   the engaging part is configured to extend from a lower side of the mobile information terminal to an upper side of the mobile information terminal, and
   the engaging part is not provided on a lower side surface of the mobile information terminal and an upper side surface of the mobile information terminal.

2. The protector of claim 1, wherein the engaging part has bent faces matched to shapes of the side faces of the mobile information terminal.

3. The protector of claim 1, wherein the engaging part has greater thickness than the sheet.

4. The protector of claim 1, wherein the sheet and the engaging part are formed with a slope therebetween, the slope being formed on a periphery of the sheet.

5. The protector of claim 1, further comprising a protection part formed on the periphery of the sheet and configured to cover a front face of the mobile information terminal.

6. The protector of claim 1, wherein the sheet is formed so as to extend beyond an area corresponding to the screen of the mobile information terminal, and
   the sheet and the engaging part are formed with a slope therebetween, the slope being formed on the periphery of the sheet.

7. The protector of claim 1, wherein the sheet is 0.3 to 0.4 mm thick.

8. The protector of claim 1, wherein the engaging part is 0.5 to 0.7 mm thick.

* * * * *